United States Patent
Bae

(10) Patent No.: US 9,318,393 B2
(45) Date of Patent: Apr. 19, 2016

(54) SEMICONDUCTOR DEVICE HAVING TEST UNIT, ELECTRONIC APPARATUS HAVING THE SAME, AND METHOD FOR TESTING THE SEMICONDUCTOR DEVICE

(71) Applicant: SK HYNIX INC., Icheon (KR)

(72) Inventor: Byung Wook Bae, Icheon (KR)

(73) Assignee: SK HYNIX INC., Icheon (KR)

( * ) Notice: Subject to any disclaimer, the term of this patent is extended or adjusted under 35 U.S.C. 154(b) by 40 days.

(21) Appl. No.: 14/197,163

(22) Filed: Mar. 4, 2014

(65) Prior Publication Data

US 2015/0097185 A1    Apr. 9, 2015

(30) Foreign Application Priority Data

Oct. 4, 2013    (KR) .................. 10-2013-0118623

(51) Int. Cl.
*H01L 23/58* (2006.01)
*H01L 21/66* (2006.01)
*H01L 23/48* (2006.01)

(52) U.S. Cl.
CPC .............. *H01L 22/14* (2013.01); *H01L 22/34* (2013.01); *H01L 23/481* (2013.01); *H01L 2924/0002* (2013.01)

(58) Field of Classification Search
CPC ........ H01L 22/00; H01L 22/30; H01L 23/481
USPC ........................................ 438/14, 18; 257/48
See application file for complete search history.

(56) References Cited

U.S. PATENT DOCUMENTS

| 2011/0084385 | A1 | 4/2011 | Itaya et al. |
| 2012/0153280 | A1 | 6/2012 | Kim et al. |
| 2012/0206160 | A1* | 8/2012 | Wu et al. .................. 324/756.07 |

FOREIGN PATENT DOCUMENTS

| JP | 3153023 B2 | 3/2001 |
| KR | 10-0549347 B1 | 2/2006 |
| KR | 10-1002048 B1 | 12/2010 |
| KR | 10-2012-0068482 A | 6/2012 |

* cited by examiner

*Primary Examiner* — Brook Kebede

(57) ABSTRACT

A semiconductor device can detect a defective or faulty part caused by copper (Cu) ions migrated from a through silicon via (TSV), resulting in improvement of device characteristics and reliability. The semiconductor device includes: a semiconductor substrate including an active region defined by a device isolation region; a through silicon via (TSV) formed to pass through the semiconductor substrate; and a test unit formed in the vicinity of the TSV so as to determine the presence or absence of metal pollution caused by the TSV.

16 Claims, 16 Drawing Sheets

SEMICONDUCTOR DEVICE HAVING TEST UNIT, ELECTRONIC APPARATUS HAVING THE SAME, AND METHOD FOR TESTING THE SEMICONDUCTOR DEVICE

CROSS-REFERENCE TO RELATED APPLICATION

The priority of Korean patent application No. 10-2013-0118623 filed on 4 Oct. 2013, the disclosure of which is hereby incorporated by reference in its entirety, is claimed.

BACKGROUND

Embodiments relate to a semiconductor device, and more particularly to a technology for detecting a defective or faulty part caused by copper (Cu) ions migrated from a through silicon via (TSV), resulting in improvement of device characteristics and reliability.

Among packaging technologies of semiconductor integrated circuits (ICs), a three-dimensional (3D) stack technology has been rapidly developed to increase packaging density and reduce the size of electronic components, resulting in production of high-performance semiconductor devices. A 3D stacked package is formed by stacking a plurality of chips that have the same or different memory capacity, and is generally called a chip stack package.

A chip stack package can be mass produced at a relatively reduced cost compared to a single-layered chip package. However, in a stack chip package, as the number and size of stacked chips increase, a line space for electrical connection of the stacked chips may be reduced to an insufficient size.

In order to address the above-mentioned issues, a Through Silicon Via (TSV) structure has been proposed to implement a stack chip package. In more detail, after forming a TSV in each chip in a wafer, physical and electrical connection between chips is vertically achieved by the TSV.

However, if the TSV is repetitively exposed to heat treatment during a fabrication process, then a metallic material (e.g., Cu ion) contained in the TSV may by diffusing or permeating into an active region of the semiconductor device. As a result, electrical characteristics of a package of semiconductor devices may be deteriorated.

SUMMARY

Various embodiments are directed to providing a semiconductor device having a test unit, an electronic device having the same, and a method for testing the semiconductor device, that substantially obviate one or more problems due to limitations and disadvantages of the related art.

An embodiment relates to a semiconductor device including a test unit capable of detecting copper (Cu) ions migrated from a through silicon via (TSV).

In accordance with an aspect of the embodiment, a semiconductor device includes: a semiconductor substrate including an active region defined by a device isolation region; a contact including a metal material and formed over the semiconductor substrate; and a test unit formed in the vicinity of the contact to determine metal pollution caused by the contact.

The contact is a through silicon via (TSV) formed to pass through the semiconductor substrate or a metal contact formed over the semiconductor substrate.

In accordance with another aspect of the embodiment, a semiconductor device includes: a logic unit formed over a semiconductor substrate so as to perform a memory operation; a through silicon via (TSV) formed to pass through the semiconductor substrate; and a test unit formed between the logic unit and the TSV so as to determine the presence or absence of short-circuiting of the semiconductor substrate located in the vicinity of the TSV.

In accordance with another aspect of the embodiment, a method for testing a semiconductor device which includes a semiconductor substrate including an active region defined by a device isolation region, a through silicon via (TSV) formed to pass through the semiconductor substrate, and a test unit formed in the vicinity of the TSV, the method comprises applying a voltage to the test unit; measuring a current value flowing in the test unit; and determining a presence or an absence of short-circuiting in the test unit using the measured current value.

In accordance with another aspect of the embodiment, an electronic device includes: a memory device configured to store data and read the stored data in response to a data input/output (I/O) control signal; and a memory controller configured to generate the data I/O control signal, and perform control data I/O operations of the memory device, wherein the memory device includes: a semiconductor substrate including an active region defined by a device isolation region; a contact including a metal material and formed over the semiconductor substrate; and a test unit formed in the vicinity of the contact so as to determine a presence or an absence of metal pollution caused by the contact.

The test unit includes: first and second connection structures spaced apart from each other by a predetermined distance and formed over the semiconductor substrate; a third connection structure formed over the active region between the first and second connection structures; and a fourth connection structure coupled to the second connection structure, and wherein the applying the voltage to the test unit includes: applying a ground voltage to the third connection structure; and applying a power-supply voltage to the fourth connection structure.

The measuring the current value flowing in the test unit includes: measuring a current value flowing in the semiconductor substrate located below the third connection structure.

When a voltage lower than the power supply voltage is applied to the first metal contact, copper (Cu) ions migrated from the TSV are collected at a lower part of the first metal contact, such that a bridge is formed between the first metal contact and the first connection structure or between the first metal contact and the second connection structure.

When a voltage lower than the power supply voltage is applied to the first metal contact, a depletion region is formed at both sidewalls of the active region located at a lower part of the first metal contact.

When the power-supply voltage is applied to the second metal contact, a current path is formed between the first metal contact and the first connection structure or between the first metal contact and the second connection structure.

In accordance with another aspect of the embodiment, a semiconductor device comprises metal impurity source provided in a substrate; and first and second connection structures respectively coupled to the substrate; a metal contact coupled to the substrate between the first and the second connection structures; and an impurity concentration region disposed in the substrate under metal contact and between the first and the second connection structures.

The electronic device further comprise a processor configured to store data in the memory device by controlling the memory controller, and perform calculation corresponding to an external input command using data stored in the memory device.

The memory controller and the processor are configured in the form of a System on Chip (SoC).

The test unit is formed in a Keep Out Zone (KOZ) adjacent to the contact.

In accordance with another aspect of the embodiment, a semiconductor device a metal impurity source provided in a substrate; and first and second connection structures respectively coupled to the substrate; a metal contact coupled to the substrate between the first and the second connection structures; and an impurity concentration region disposed in the substrate under metal contact and between the first and the second connection structures.

The metal contact is configured to receive a first voltage, wherein the first connection structure is configured to receive a second voltage, and wherein the device further comprising a depletion region which is formed between the substrate and the first connection structure when the first and the second voltages are applied.

Upon applying the first and the second voltages, the impurity concentration region is configured to collect impurities originated from the metal impurity source.

Each of the first and the second connection structures includes a gate structure.

The metal impurity source includes a TSV passing though the substrate, a metal pillar formed over the substrate, or a metal pillar formed in the substrate.

In accordance with another aspect of the embodiment, a method for testing semiconductor device comprises providing a substrate including a metal impurity source; providing a test unit disposed adjacent to the metal impurity source and coupled to the substrate; activating the test unit to create depletion regions in the substrate and an impurity concentration region in the substrate between the depletion regions; detecting a current flowing through the impurity concentration region; and determining that the semiconductor device is defective when the detected current satisfies a predetermined value.

It is to be understood that both the foregoing general description and the following detailed description of embodiments are exemplary and explanatory.

DESCRIPTION OF EMBODIMENTS

Reference will now be made in detail to embodiments of the embodiments, examples of which are illustrated in the accompanying drawings. Wherever possible, the same reference numbers are used throughout the drawings to refer to the same or like portions. In the following description of the embodiments, a detailed description of related known configurations or functions incorporated herein may be omitted.

Generally, due to thermal stress of a through silicon via (TSV) formed in a semiconductor device, when a semiconductor device element is formed adjacent to the TSV, the element tends to show poor electrical characteristics and low reliability. Thus, the semiconductor device includes a Keep Out Zone (KOZ) in which a semiconductor element is not formed. Typically, the semiconductor device has a Keep Out Zone (KOZ) of 10 μm or greater. The following embodiments relate to a test unit contained in the KOZ, and more particularly to a technology for detecting short-circuiting between a metal contact and a transistor caused by metal ion migrated from the TSV through a test unit 300 before a packaging process. Here, TSV serves as a metal impurity source.

Embodiments will hereinafter be described with reference to FIGS. 1 to 13.

Figure 1:
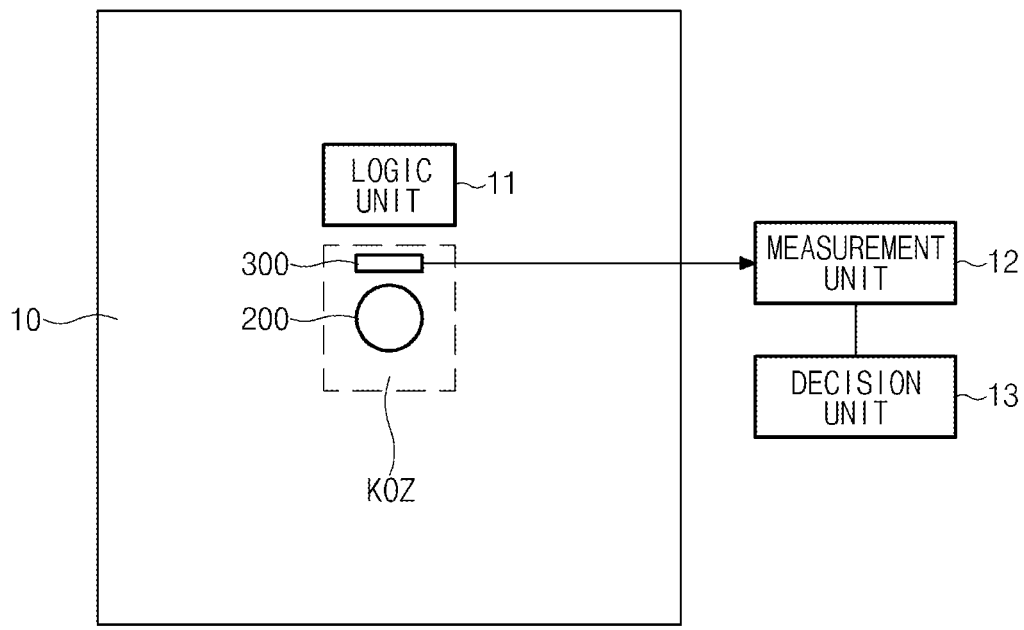
FIG. 1 is a plan view illustrating a semiconductor device according to an embodiment.

FIG. 1 is a plan view illustrating a semiconductor device according to an embodiment.

Referring to FIG. 1, a semiconductor chip 10 of the semiconductor device includes a logic unit 11 including a transistor (not shown) for performing a memory operation of the semiconductor device; a through silicon via (TSV) structure 200 for packaging the semiconductor device; and a test unit 300 formed in a Keep Out Zone (KOZ) located in the vicinity of the TSV structure. An external measurement unit 12 and a external decision unit 13 may be coupled to the test unit 300.

The test unit 300 is formed to detect copper (Cu) ion migrated from the TSV structure 200, and may be formed simultaneously when a transistor (not shown) of the logic unit 11 is formed. Although FIG. 1 exemplarily shows that the test unit 300 is located at one side of the TSV structure 200 for convenience of description and better understanding of the embodiment, the test unit 300 may be formed at any position of the KOZ. The logic unit 11 is not limited only to exemplary positions shown in FIG. 1, but may be formed at any position other than the KOZ, and may be modified at any time according to a semiconductor design.

In addition, although a cell region is not shown in FIG. 1, the cell region may be formed at various positions according to external design of a box denoted by 'KOZ'.

The measurement unit 12 is coupled to the test unit 300, measures a current flowing in an active region (not shown) of the test unit 300, and transfers the measurement result to the decision unit 13.

If the current value measured by the measurement unit 12 deviates from a predetermined range, the decision unit 13 may determine the semiconductor chip 10 to be defective.

Figure 2A:
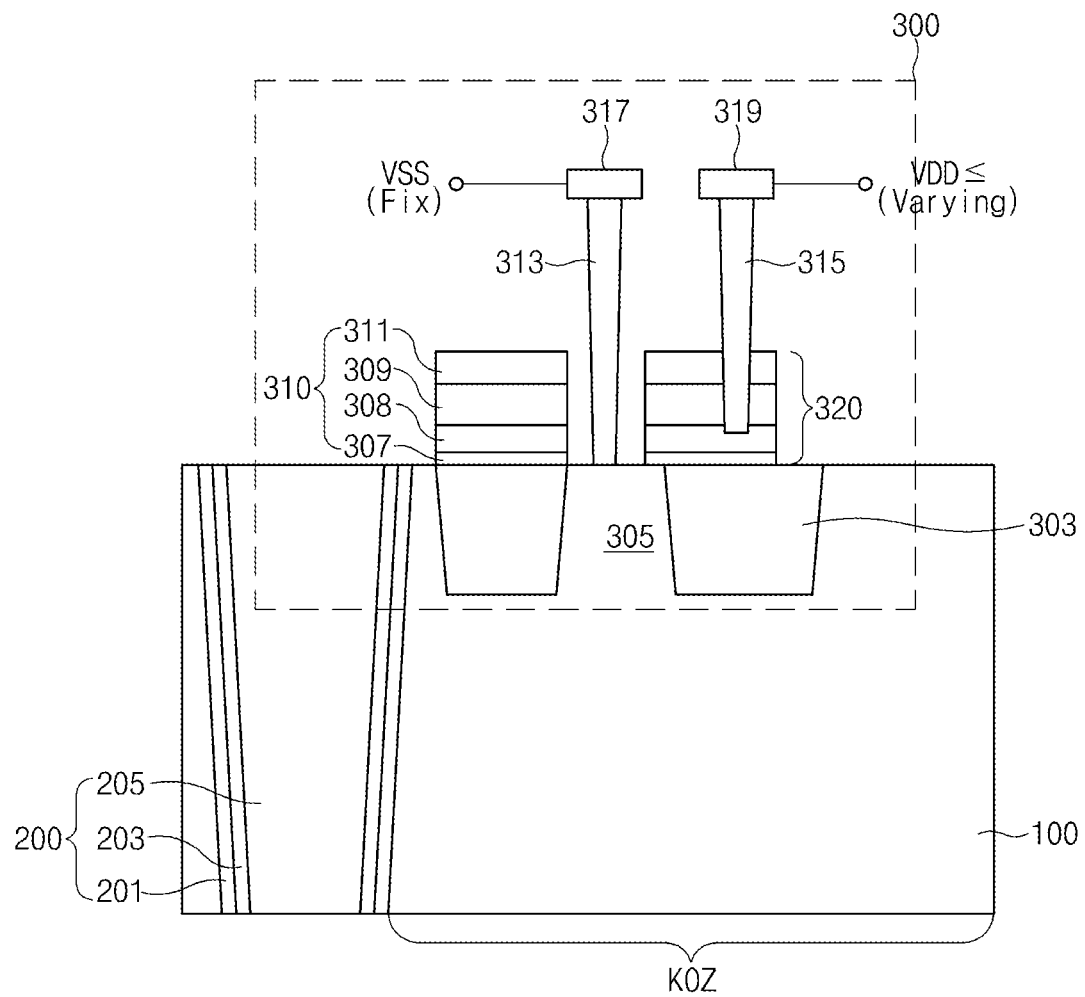
FIG. 2A is a cross-sectional view illustrating a semiconductor device according to a first embodiment.

FIG. 2A is a cross-sectional view illustrating a semiconductor device according to the first embodiment.

Referring to FIG. 2A, the semiconductor device according to the first embodiment includes a device isolation region 303 for defining an active region 305 in a semiconductor substrate 100; a through silicon via (TSV) structure 200 formed at one side of the semiconductor substrate 100; and a test unit 300 formed in a Keep Out Zone (KOZ) adjacent to the TSV structure 200.

After the TSV 205 forms a via hole (not shown) by passing through the semiconductor substrate 100, the via hole is buried with copper (Cu) such that the resultant TSV 205 is formed. The TSV 200 may include a metal barrier film 203 formed at a sidewall of the TSV 205, and an insulation film 201 formed at a sidewall of the metal barrier film 203. The TSV 200 may further include a nitride film (not shown) at a sidewall of the insulation film 201. The insulation film 201 may be formed of an oxide film.

While an additional process is in progress after formation of the TSV 205, copper (Cu) ions forming the TSV 205 may flow into the semiconductor substrate 100 along the insulation film 201. Specifically, the Cu ions are collected in the active region such that a bridge occurs between transistors, resulting in the occurrence of a defective memory element due to the bridge. In particular, a defective memory action caused by migration of Cu ions may not immediately occur instead appearing after passage of a certain time period and becoming more severe over time. As a result, a defective part in the chip-shaped memory may not be identified until after the memory has been fabricated in the form of a chip.

In order to detect migration of Cu ion in an earlier stage, the semiconductor device according to the embodiments includes a test unit 300.

Referring to FIG. 2A, the test unit 300 includes a first gate structure 310, a second gate structure 320, first and second metal contacts (313, 315), and first and second metal pads (317, 319). Here, the first gate structure 310, the second gate structure 320, and the first and second metal contacts 313, 315 may hereinafter be collectively referred to as a connection structure for electrical connection.

Each of the first gate structure 310 and the second gate structure 320 is formed by stacking a gate insulation film 307, a polysilicon layer 308, a metal layer 309, and a capping film 311. In this case, the gate insulation film 307 may include an oxide film. The gate insulation film 307 is formed to protect the surface of a semiconductor substrate formed of a silicon material, and may be deposited by performing a Chemical Vapor Deposition (CVD) process on High-K materials such as SiO, ONO, HfO$_2$x, ZrO or PZT materials or by heating the semiconductor substrate in a furnace. Also, the gate insulation film 307 may be obtained by depositing High-K materials such as Zr or Hf over the surface of the semiconductor substrate 100 by an Atomic Layer Deposition (ALD) process to be subject to natural oxidation.

The first metal pad 317 is electrically coupled to the first gate structure 310, and receives a fixed ground voltage (VSS) through the first metal pad 317. The second metal pad 319 is electrically coupled to the second gate structure 320, and receives a variable power-supply voltage (VDD) through the second metal pad 319.

The first metal contact 313 is formed over the active region 305 between the first gate structure 310 and the second gate structure 320. If a ground voltage is applied to the first metal pad 317, migrated Cu ions are crystallized at a lower part of the first metal contact 313.

The second metal contact 315 is formed over the second gate structure 320, and the second metal contact 315 is coupled to the polysilicon layer 308 of the second gate structure 320.

Figure 2B:
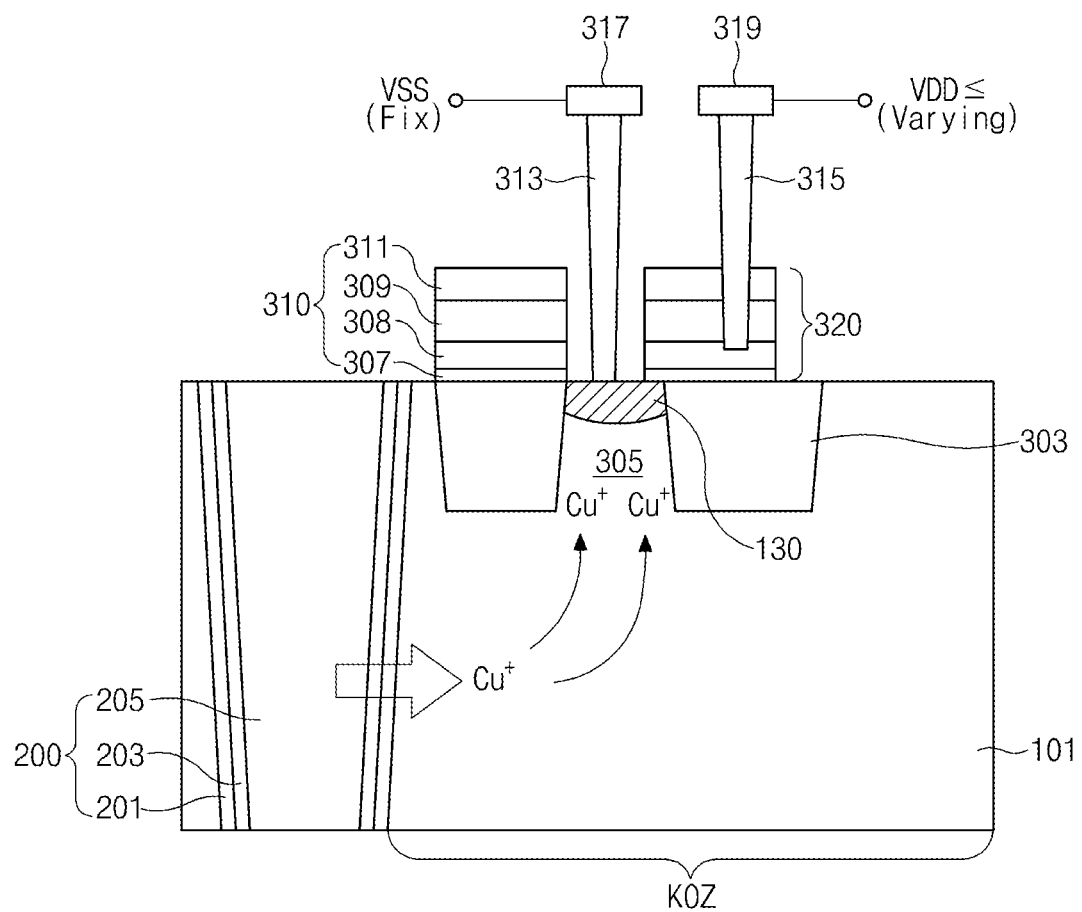
FIG. 2B is a cross-sectional view illustrating a movement path of copper (Cu) ion according to the first embodiment.

FIG. 2B is a cross-sectional view illustrating a movement path of copper (Cu) ion according to the first embodiment. The test unit 300 according to the embodiment will hereinafter be described with reference to FIG. 2B. If Cu ions of the TSV 205 are migrated, the Cu ions arrive not only at the gate structures (310, 320) of the test unit 300 located closest to the TSV 205 but also at the active region 305. Subsequently, if Cu ions are accumulated, the accumulated Cu ions are crystallized at the active region 305 located below the first metal contact 313 having a ground voltage (VSS), such that a bridge 130 between the first gate structure 310 and the second gate structure 320 is formed.

Thus, assuming that a power-supply voltage (VDD) of a predetermined level or higher is applied to the second metal contact 315 through the second metal pad 319 under the condition that a ground voltage (VSS) is applied to the first metal contact 313, a current may flow from the second metal contact 315 to the active region 305, such that the measurement unit 12 can measure the current flowing in the active region 305. As a result, assuming that a current value deviates from a predetermined range as shown in the graph of FIG. 3, the decision unit 130 may determine the presence or absence of short-circuiting between the first metal contact 313 and the first gate structure 310 or the presence or absence of short-circuiting between the first metal contact 313 and the second gate structure 320 using the measured current value, such that the decision unit 130 may determine the presence or absence of a defective portion.

Figure 3:
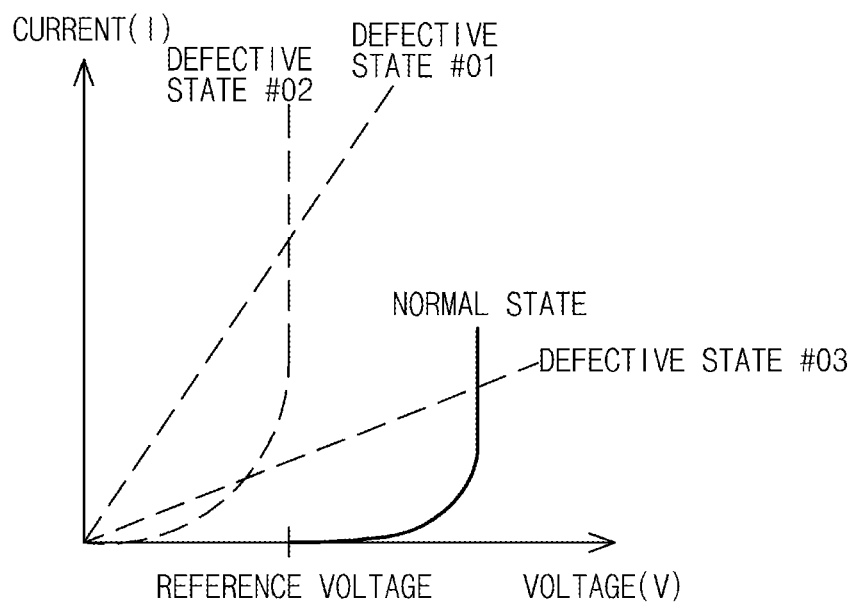
FIG. 3 is a graph illustrating a variation of current values of a normal state and a defective state when a current value of a lower part of a first metal contact is measured.

FIG. 3 is a graph illustrating a variation of current values in a lower part of a first metal contact in a normal state and in a defective state. Referring to FIG. 3, a certain level of current value is detected with respect to a reference voltage, in case of a defective state. In contrast, no current value is detected with respect to the reference voltage, in case of a normal state. In other words, if the device under test is defective, a variable voltage is applied to the second metal contact 320. Here, under the condition that the voltage applied to the second metal contact 320 is equal to or less than the reference voltage, if variation of a current is measured, the decision unit 130 may determine whether a defective part exists in the semiconductor device which is subject to test.

Therefore, if the power-supply voltage of a predetermined level is applied to the second metal contact 315 after formation of the TSV 205 and a current normally flows in the first metal contact 313, this means that the semiconductor device is in a normal state. If there arises short-circuiting between the first metal contact 313 and each of the first and second gate structures (310, 320), this means the occurrence of migration of Cu ion.

Figure 4A:
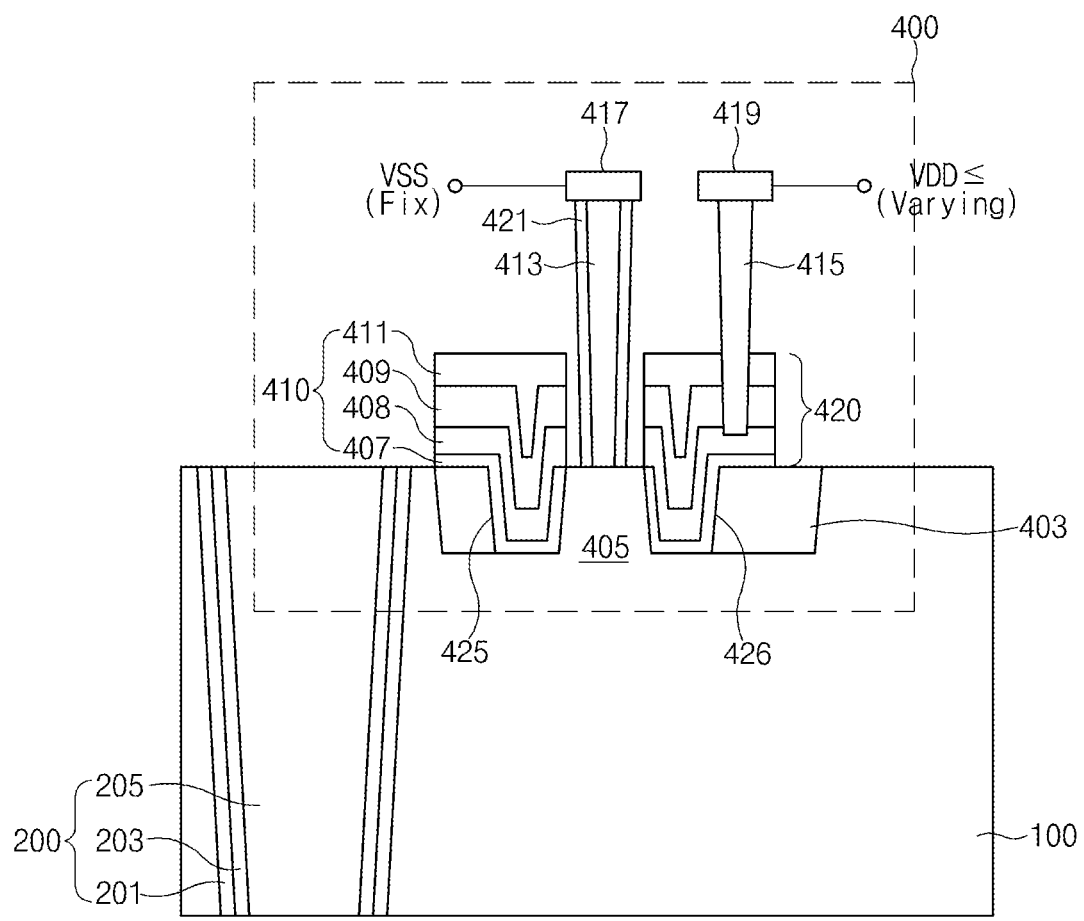
FIG. 4A is a cross-sectional view illustrating a semiconductor device according to a second embodiment.

FIG. 4A is a cross-sectional view illustrating a semiconductor device according to a second embodiment.

Referring to FIG. 4A, the semiconductor device according to the second embodiment includes a test unit 400 formed in a Keep Out Zone (KOZ) adjacent to a TSV structure 200. The test unit 400 includes a third gate structure 410, a fourth gate structure 420, a third metal contact 413, a fourth metal contact 415, a third metal pad 417, and a fourth metal pad 419. Each of the third gate structure 410 and the fourth gate structure 420 is formed by stacking a gate insulation film 407, a polysilicon layer 408, a metal layer 409, and a capping film 411. Here, the gate insulation film 407 may include an oxide film, and a method for forming the gate insulation film 407 may be similar to a method for forming the above-mentioned gate insulation film 307. In this case, the third gate structure 410, the fourth gate structure 420, the third metal contact 413, and the fourth metal contact 415 may hereinafter be collectively referred to as a connection structure.

However, according to a method for forming the third gate structure 410 and the fourth gate structure 420, after a first trench 425 and a second trench 426 are formed in a device isolation region 403, the gate insulation film 407, the polysilicon layer 408, and the metal layer 409 are sequentially stacked such that the gate insulation film 407 is formed over a sidewall and lower part of the active region 405. Specifically, after the semiconductor substrate 100 is exposed and protruded by the first trench 425 and the second trench 426. The first trench 425 and the second trench 426 are formed in the device isolation region 403. The gate insulation film 407 is formed over the exposed semiconductor substrate 100.

Figure 4B:
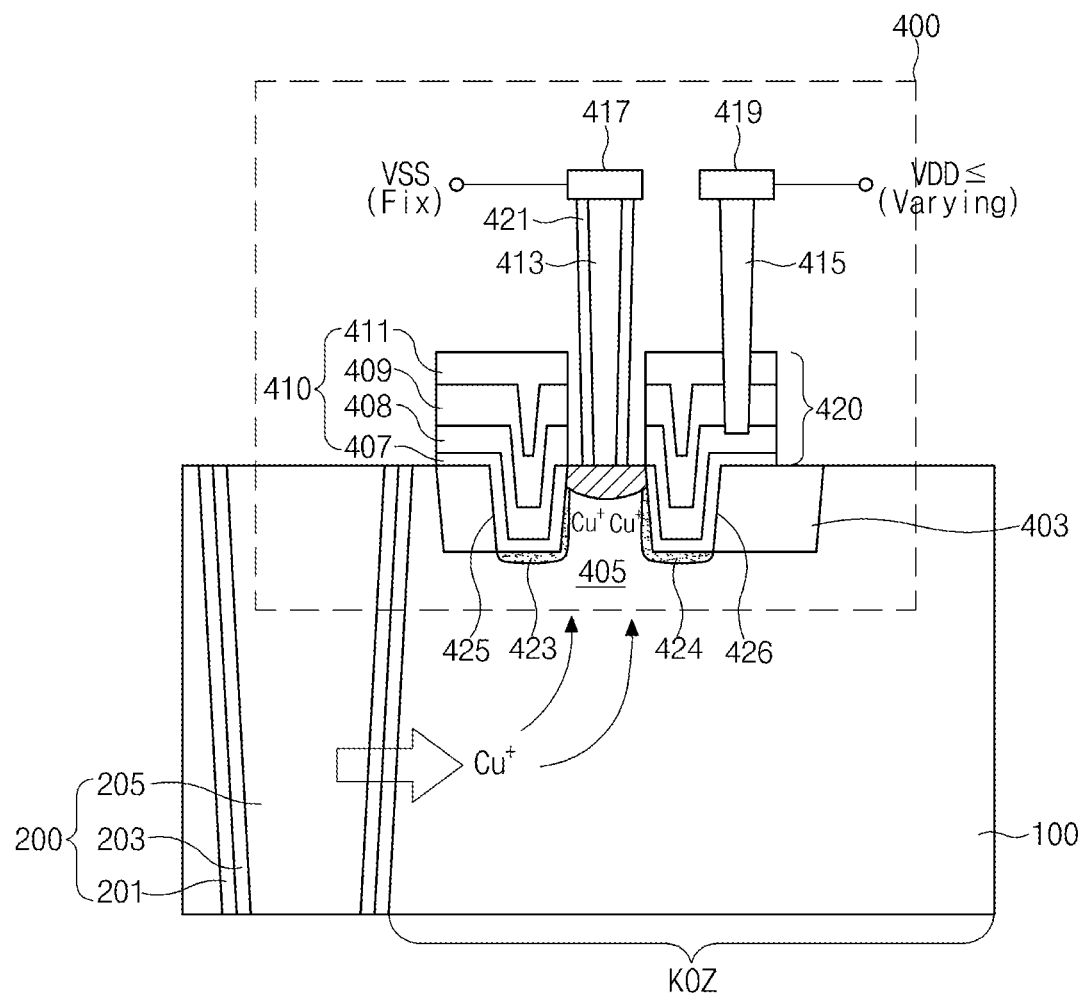
FIG. 4B is a cross-sectional view illustrating a movement path of copper (Cu) ion according to the second embodiment.

FIG. 4B is a cross-sectional view illustrating a movement path of copper (Cu) ion according to the second embodiment. Referring to FIG. 4B, since the gate insulation film 407 is formed over a sidewall and lower part of the exposed active region 405, depletion layers (423, 424) are formed, along a contour of the gate insulation film 407, in the active region 405 when the power-supply voltage (VDD) is applied to the fourth metal contact 415. As a result, the depletion layer 423 is used as a barrier film, such that Cu ions migrated from the TSV structure 200 are not trapped into the gate insulation film 407 and much more Cu ions are collected in a lower part of the third metal contact 413.

Accordingly, the test unit 400 is formed to collect Cu ions migrated from the TSV structure 200 so that a bridge defect can be formed. Thereby, a defect due to Cu migration can be detected earlier, desirably prior to a packaging process.

It may be desirable to minimize a space between the third metal contact 413 and the third gate structure 410, and a space between the third metal contact 413 and the fourth gate structure 420. A spacer 421 may be formed at a sidewall of the third metal contact 413 to insulate the third metal contact 413 from the third gate structure 410 or the fourth gate structure 420. As a result, the third metal contact 413 is formed to have a larger width, the spacing between the third metal contact 413 and the third gate structure 410 and the spacing between the third metal contact 413 and the fourth gate structure 420 are reduced in size such that an amount and a speed at which Cu ions are collected at a lower part of the third metal contact 413 can be facilitated. Accordingly, detection of a bridge defect can be achieved more quickly. In this case, the spacer 421 may be formed of a nitride material.

The test unit shown in FIG. 2A and the test unit 400 shown in FIG. 4A may be formed simultaneously with formation of a transistor (not shown) of the cell region.

As described above, the test units (300, 400) according to the embodiments can be formed in a KOZ. Thus, the chip size need not be increased. Where a bridge caused by Cu ions migrated from the TSV 205 exists, it is quickly and easily detectable. Thus, a defective device can be identified prior to a packaging stage.

Figure 5:
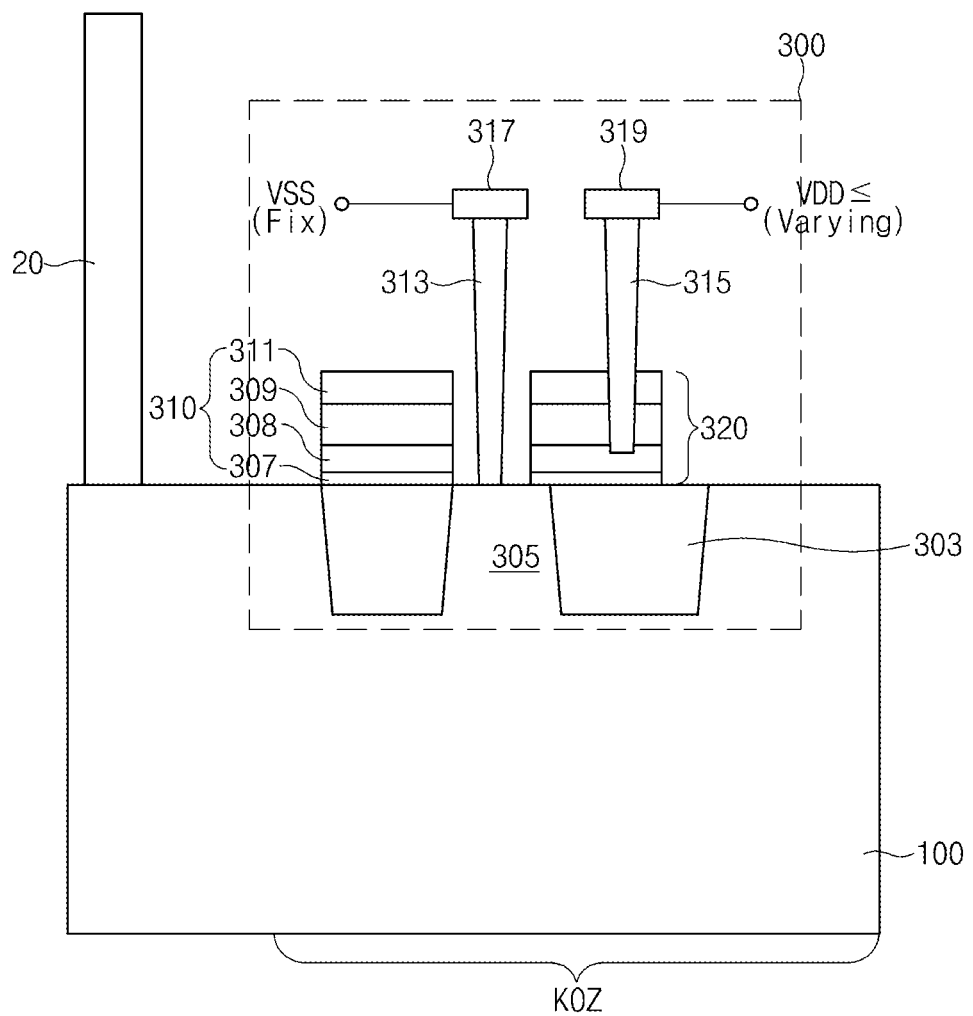
FIG. 5 is a cross-sectional view illustrating a semiconductor device according to a third embodiment.

FIG. 5 is a cross-sectional view illustrating a semiconductor device according to a third embodiment.

Figure 6:
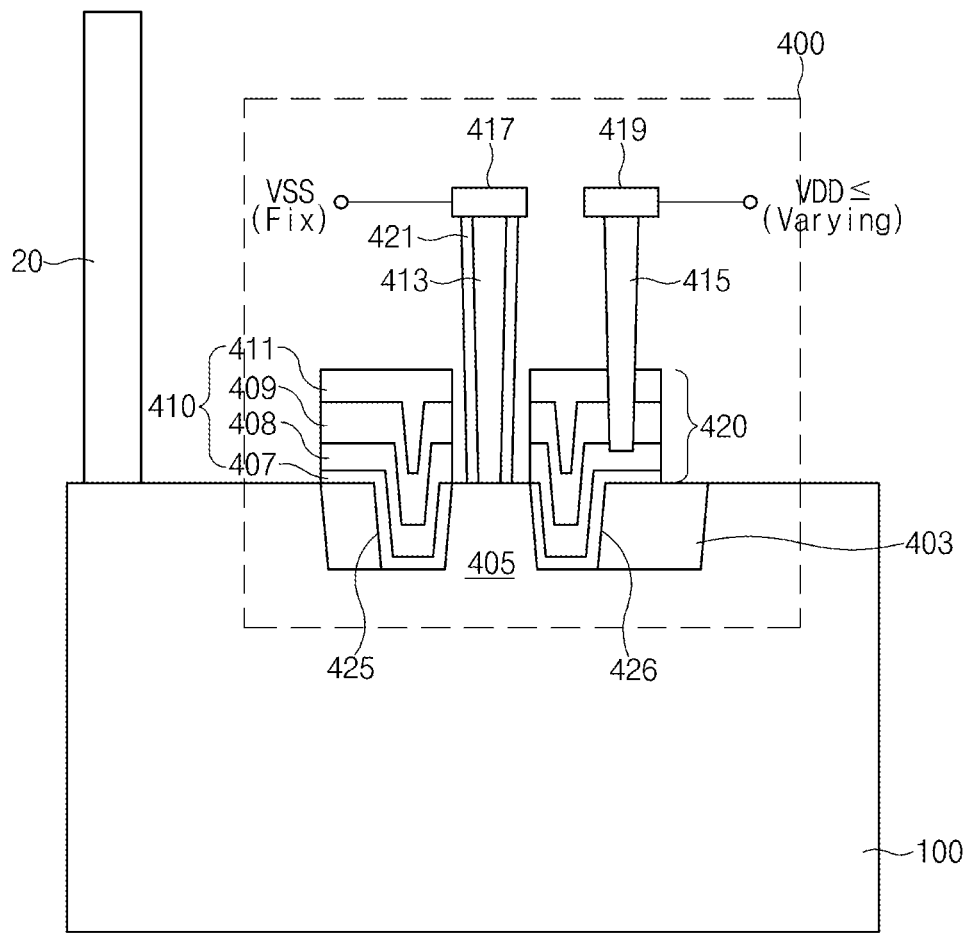
FIG. 6 is a cross-sectional view illustrating a semiconductor device according to a fourth embodiment.

Referring to FIG. 5, the semiconductor device according to the third embodiment includes a test unit 300 for detecting metal ions (such as Cu ions) migrated from a metal contact or a metal line 20, instead of a TSV. Here, the metal contact or the metal line 20 may include metal ions such as Cu ions. Here, the metal contact or the metal line 20 serves as a metal impurity source. The test unit 300 of FIG. 5*may* be the same in structure as the test unit 300 shown in the first embodiment. The test unit 300 of FIG. 5 may detect the presence or absence of short-circuiting due to a bridge defect caused by metal ions such as Cu ions migrated from the metal contact or the metal line 20. FIG. 6 is a cross-sectional view illustrating a semiconductor device according to a fourth embodiment.

Referring to FIG. 6, the semiconductor device according to the fourth embodiment includes a test unit 400 for detecting metal ions (such as Cu ions) migrated from a metal contact or a metal line 20. Here, the metal contact or the metal line 20 may include metal ions such as Cu ions. The test unit 400 of FIG. 6 may be the same in structure as the test unit 400 shown in the second embodiment. The test unit 400 of FIG. 6 may detect the presence or absence of short-circuiting caused by metal ions such as Cu ions migrated from the metal contact or the metal line 20.

Figure 7:
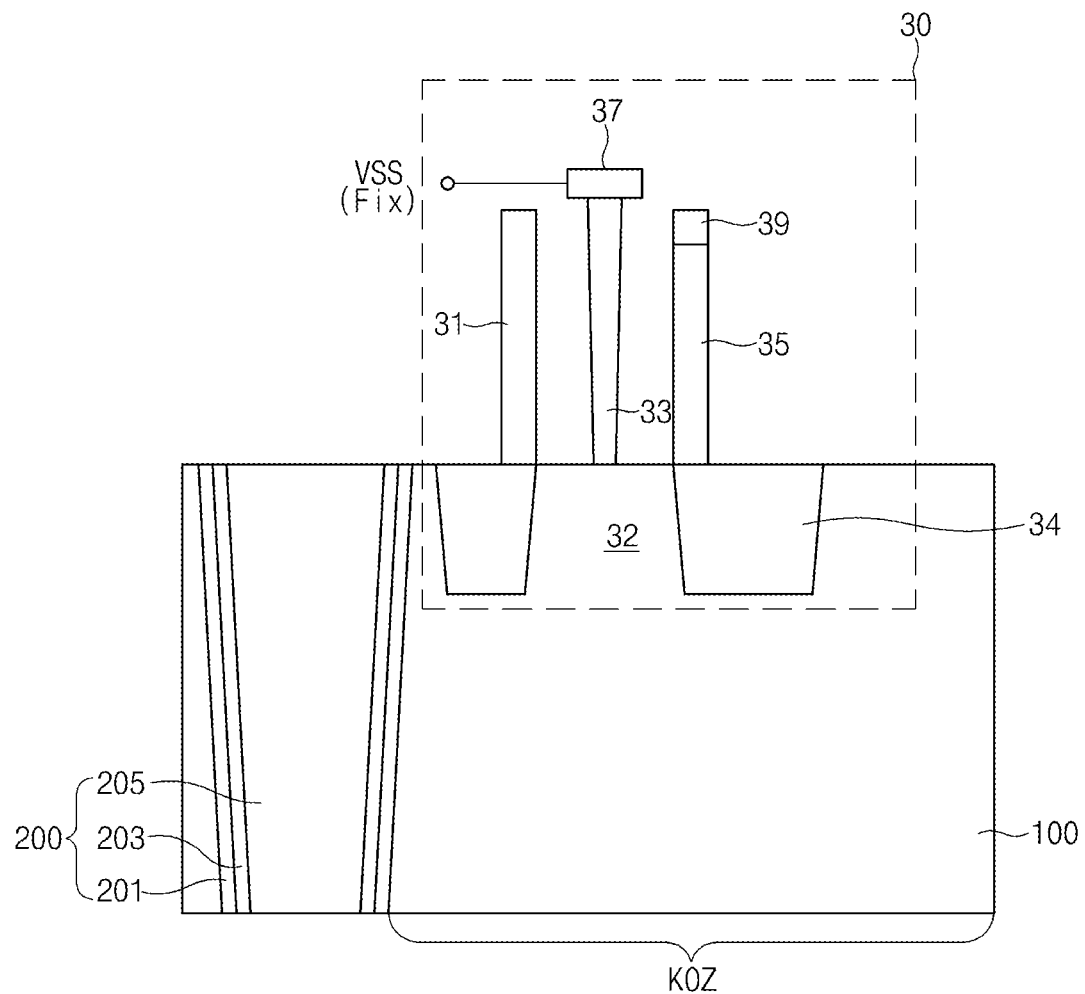
FIG. 7 is a cross-sectional view illustrating a semiconductor device according to a fifth embodiment.

FIG. 7 is a cross-sectional view illustrating a semiconductor device according to a fifth embodiment.

Referring to FIG. 7, the test unit 30 according to the fifth embodiment includes a fifth metal contact 31, a sixth metal contact 33, a seventh metal contact 35, a fifth metal pad 37, and a sixth metal pad 39. In this case, the fifth metal contact 31, the sixth metal contact 33, and the seventh metal contact 35 may be collectively referred to as a connection structure. The fifth metal contact 31 and the seventh metal contact 35 are respectively formed over the separated device isolation regions 34, and the sixth metal contact 33 is formed over the active region 32 between the device isolation regions 34. The fifth metal pad 37 and the sixth metal pad 39 are formed over the sixth metal contact 33 and the seventh metal contact 35, respectively. In order to detect migration of Cu ions, a ground voltage (VSS) is applied to the fifth metal pad 37 and a variable voltage is applied to the sixth metal pad 39.

As described above, by providing a test unit including a detecting metal contact formed of a metal material, the semiconductor device according to the embodiments can detect short-circuiting (or an electrical bridge defect) caused by metal ions (metal impurities) migrated from the TSV 200 or the metal line 20. In addition, the test units (300, 400) may further include gate electrodes and a metal contact. The test unit 30 is configured to detect short-circuiting either between the metal contact and the gate electrodes or between the metal line and each metal contact.

Figure 8:
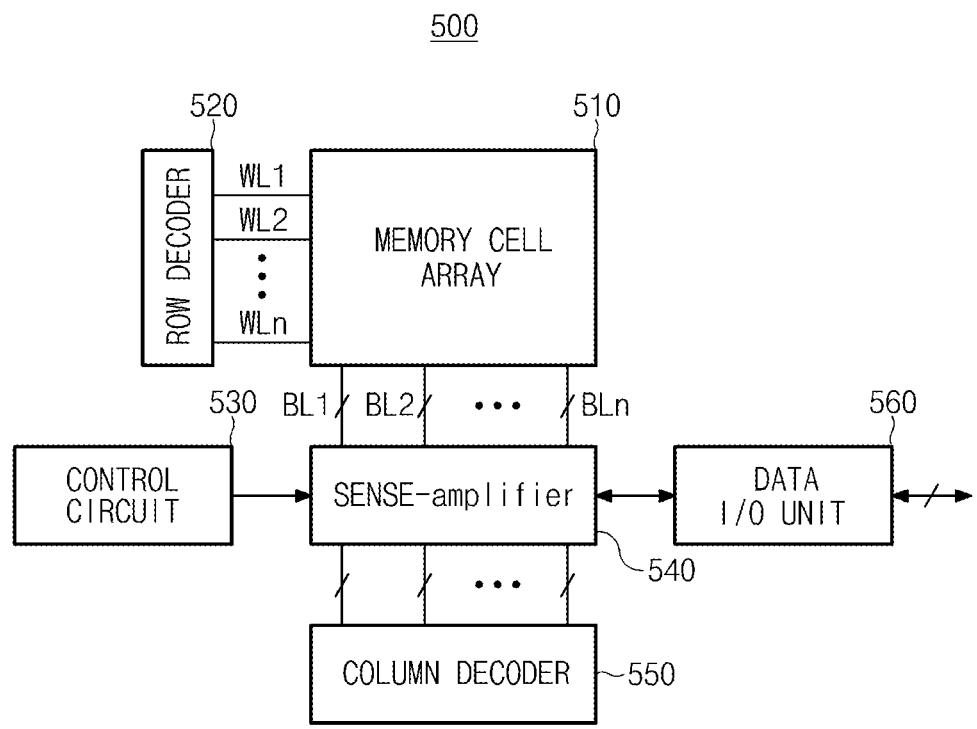
FIG. 8 is a block diagram illustrating a memory device according to an embodiment.

FIG. 8 is a block diagram illustrating a memory device according to an embodiment.

Referring to FIG. 8, the memory device 500 includes a memory cell array 510, a row decoder 520, a control circuit 530, a sense-amplifier (sense-amp) 540, a column decoder 550, and a data Input/Output (I/O) circuit 560.

The memory cell array 510 includes a plurality of word lines (WL1-WLn) (where 'n' is a positive integer), a plurality of bit lines (BL1-BLn), and a plurality of memory cells (not shown) interconnected between the word lines (WL1-WLn) and the bit lines (BL1-BLn). Here, the memory cells (not shown) are arranged in the form of a matrix. Each memory cell includes a transistor serving as a switching element that is turned on or off in response to a voltage applied to the word lines (WL1-WLn), and each transistor includes a gate (not shown) and a source/drain region (junction region) (not shown).

The row decoder 520 generates a word line selection signal (row address) for selecting a memory cell in which data is to be read or written, and outputs the word line selection signal to the word lines (WL1-WLn) so as to select any one of the word lines (WL1-WLn).

A control circuit 530 controls the sense-amplifier 540 in response to a control signal (not shown) received from an external part.

The sense-amplifier 540 may sense/amplify data of each memory cell, and may store data in each memory cell. In this case, the sense-amplifier 540 may include a plurality of sense-amplifiers (not shown) for sensing/amplifying data corresponding to a plurality of bit lines (BL1-BLn), and each sense-amplifier may sense/amplify data of the plurality of bit lines (BL1-BLn) in response to a control signal generated from the control circuit 530. The sense-amplifiers are respectively configured to sense/amplify data pieces of the bit lines (BL1-BLn) in response to the control signal generated from the control circuit 530.

The column decoder 550 generates column selection signals for operating the sense-amplifiers coupled to cells selected by the row decoder 520, and outputs the column selection signals to the sense-amplifier 540.

The data Input/Output (I/O) circuit 560 may transmit write data received from an external part to the sense-amplifier 540 in response to a plurality of column selection signals generated from the column decoder 550, and may output read data sensed/amplified by the sense-amplifier 540 to the external part in response to the column selection signals generated from the column decoder 550.

The row decoder 520, the control circuit 530, the sense-amplifier 540, and the column decoder 550 from among the constituent elements of the above-mentioned memory device 500 may be substantially identical to those of the conventional memory device.

As described above, the memory device 500 may include a plurality of TSVs in a semiconductor substrate for implementation of a stack structure, and may include a test unit for detecting copper (Cu) ions migrated from the TSVs in a Keep Out Zone (KOZ) located in the vicinity of the TSVs. The test unit is formed in the KOZ as shown in FIG. 2, and may determine the presence or absence of short-circuiting between a metal contact and a gate structure by applying a voltage to the active region through the metal contact, thereby detecting migration of Cu ions.

Figure 9:
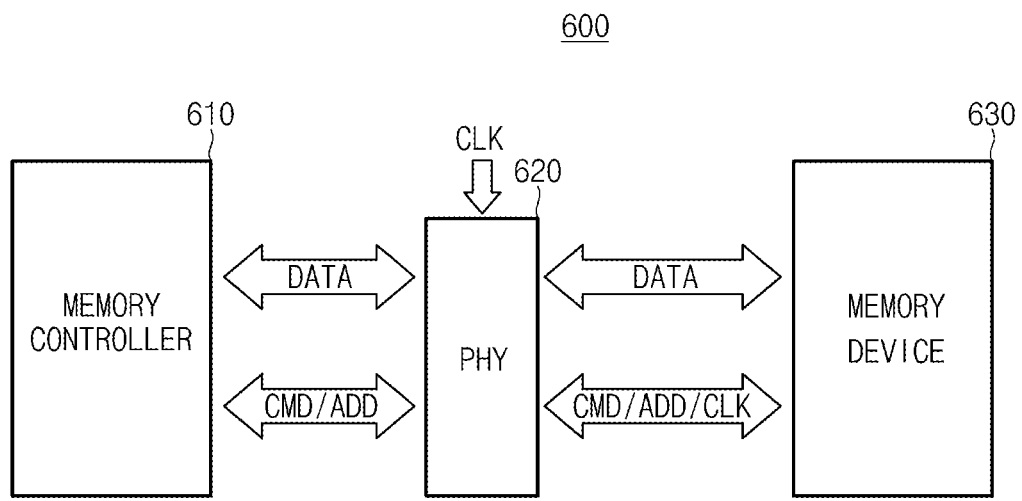
FIG. 9 is a block diagram illustrating an electronic device including a memory device according to an embodiment.

FIG. 9 is a block diagram illustrating an electronic device including a memory device according to an embodiment.

Referring to FIG. 9, the electronic device 600 may include a memory controller 610, a memory interface (PHY) 620, and a memory device 630.

The memory controller 610 generates data I/O control signals (command signal (CMD), address signal (ADD), etc.) for controlling the memory device 630, outputs the data I/O control signals to the memory device 630 through the memory interface 620, and thus controls data I/O operations (also called 'data Read/Write operations') of the memory device 630. The memory controller 610 may include a control unit for controlling a general data processing system to input/output data to/from the memory devices. The memory controller 610 may be embedded in a processor of electronic devices (for example, a Central Processing Unit (CPU), an Application Processor (AP), a Graphic Processing Unit (GPU), etc.), or may be configured in the form of a System on Chip (SoC) and be fabricated in one chip along with the processors. Although the memory controller 610 of FIG. 9 is denoted by one block, the memory controller 610 may include a controller of a volatile memory and a controller of a non-volatile memory.

The memory controller 610 may include a conventional controller for controlling a variety of memories. For example, the conventional controller may control Integrated Device Electronics (IDE), Serial Advanced Technology Attachment (SATA), Small Computer System Interface (SCSI), Redundant Array of Independent Disks (RAID), Solid State Disc (SSD), External SATA (eSATA), Personal Computer Memory Card International Association (PCMCIA), Multi Media Card (MMC), Embedded MMC (eMMC), Compact Flash (CF), Graphic Card, etc.

The memory interface 620 may provide a physical layer interface between the memory controller 610 and the memory device 630, and may process a time point of data communicated between the memory controller 610 and the memory device 630 in response to a clock signal (CLK).

The memory device 630 may include a plurality of memory cells for storing data therein, store data (DATA) or read the stored data (DATA) upon receiving control signals (CMD, ADD) from the memory controller 610 through the memory interface 620, and then output the read data to the memory interface 620. In this case, the memory device 630 may include the memory device 500 shown in FIG. 8.

The memory device 630 may include a non-volatile memory and a volatile memory. The volatile memory may include a Dynamic Random Access Memory (DRAM), a Mobile DRAM, a Static Random Access Memory (SRAM), etc. The non-volatile memory may include a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc. In addition, the memory device 630 shown in FIG. 26 is denoted by only one block, and may include a plurality of memory chips. If the memory device 630 is comprised of a plurality of memory chips, the memory chips may be stacked on a substrate (board) or may be mounted in a planar fashion onto the substrate (board).

The memory device 630 may include a plurality of TSVs in a semiconductor substrate, and may include a test unit for detecting copper (Cu) ions migrated from the TSV. The test unit is formed in a Keep Out Zone (KOZ) which is located in the vicinity of the TSV, and may determine the presence or absence of short-circuiting between a detecting metal contact and a gate structure by applying a voltage to the active region through the metal contact, thereby detecting migration of Cu ions.

Figure 10A:
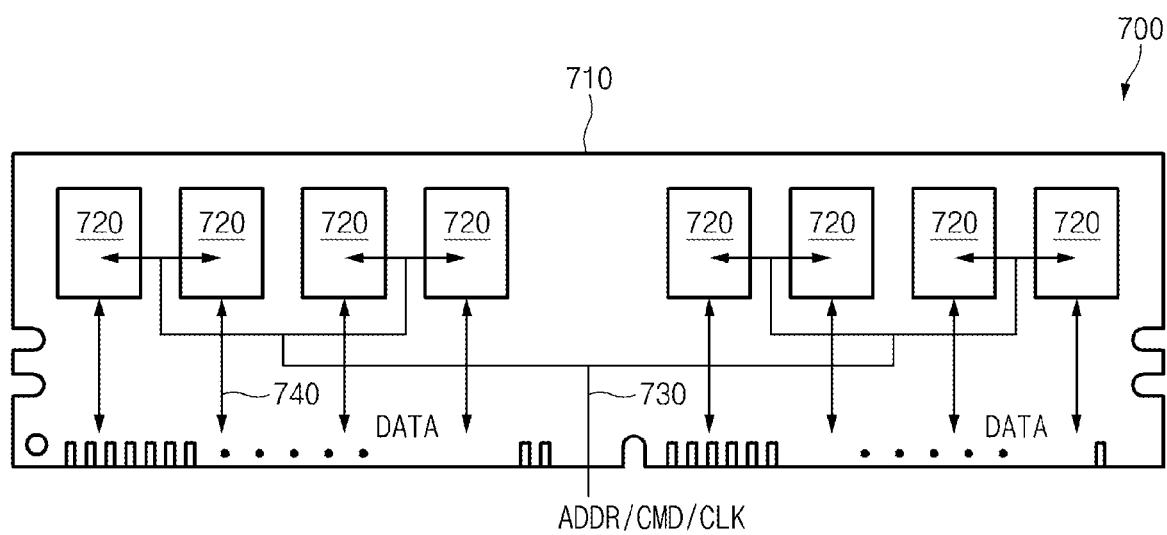
FIGS. 10A and 10B illustrate various examples of the memory device shown in FIG. 9.
Figure 10B:
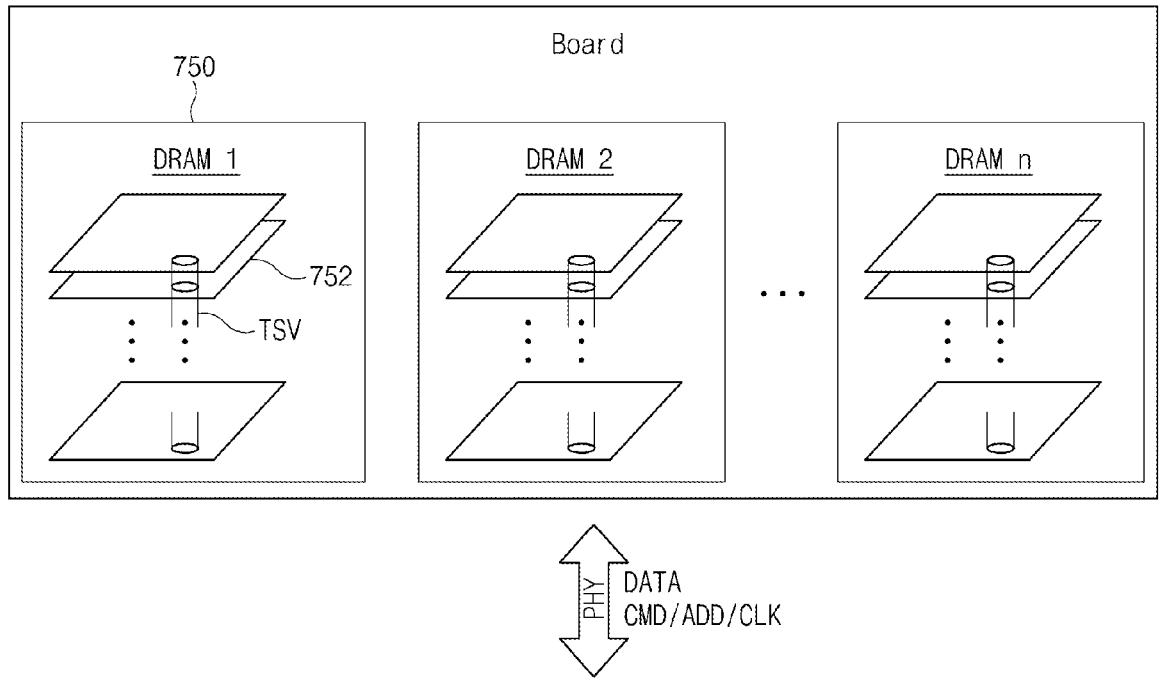

FIGS. 10A and 10B illustrate various examples of the memory device 630 shown in FIG. 9.

Referring to FIG. 10A, several memory chips 720 are mounted to a module substrate 710 in such a manner that the memory chips 720 can be inserted into memory slots of a computer.

The semiconductor module 700 includes a plurality of memory chips 720 mounted to a module substrate 710, a command link 730 for receiving signals (ADD, CMD, and CLK) controlling the memory chips 720, and a data link 740 for receiving I/O data of the memory chips 720.

In this case, each memory chip 720 may include a plurality of memory devices 500 shown in FIG. 8, and a semiconductor substrate of each memory chip 720 may include a through silicon via (TSV). In this case, a test unit for detecting copper (Cu) ions migrated from the TSV may be contained in a Keep Out Zone (KOZ) located in the vicinity of the TSV. The test unit is formed in the KOZ as shown in FIG. 2, and may determine the presence or absence of short-circuiting between a metal contact and a gate structure by applying a voltage to the active region through the metal contact, thereby detecting migration of Cu ions.

Although FIG. 10A exemplarily shows that memory chips 720 are mounted only at the front surface of the module substrate 710, it should be noted that the memory chips 720 can also be mounted to a back surface of the module substrate 710 without departing from the scope of the embodiment. In this case, the number of memory chips 720 mounted to the module substrate 710 is not limited only to the example of FIGS. 10A and 10B. In addition, a material and structure of the module substrate 710 are not specially limited.

FIG. 10B illustrates another example of the memory device shown in FIG. 9.

Referring to FIG. 10B, the memory device 750 may be implemented by stacking/packaging a plurality of semiconductor layers (semiconductor chips) 752, and at least one memory device 750 may be mounted to a board (substrate) and operate in response to a control signal of the memory controller 610. In this case, the memory device 750 may include a specific structure in which the same semiconductor layers (chips) are interconnected through a through silicon via (TSV). Alternatively, semiconductor layers (chips) different from each other may be interconnected through a through silicon via (TSV) to form a heterogeneous semiconductor. Although FIG. 10B illustrates that signal transmission between semiconductor layers is achieved through a TSV, for convenience of description, the embodiment is not limited thereto, and the embodiment can also be applied to a semiconductor device employing a wire bonding structure, an interposed structure, or a stack structure achieved through a tape including wires or lines, etc.

In this case, a semiconductor layer 752 may include the memory device 500 shown in FIG. 8. That is, a test unit for detecting copper (Cu) ions migrated from the TSV may be contained in a Keep Out Zone (KOZ) located in the vicinity of the TSV of the semiconductor layer 752. The test unit is formed in the KOZ as shown in FIG. 2, and may determine the presence or absence of short-circuiting between a metal contact and a gate structure by applying a voltage to the active region through the metal contact, thereby detecting migration of Cu ions.

Figure 11:
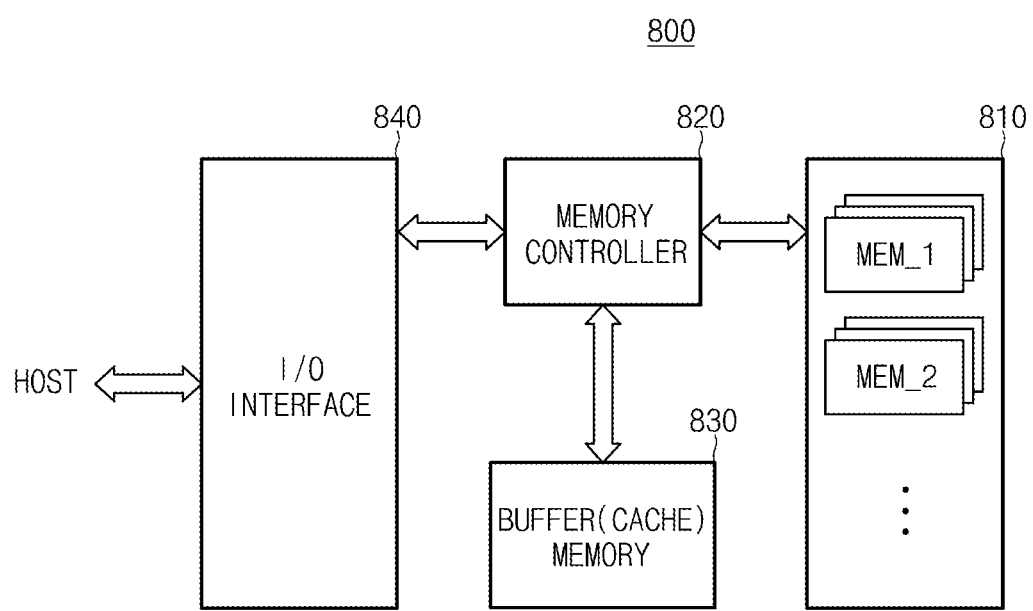
FIG. 11 is a block diagram illustrating a memory system according to another embodiment.

FIG. 11 is a block diagram illustrating a memory system according to another embodiment.

Referring to FIG. 11, the electronic device 800 may include a data storage unit 810, a memory controller 820, a buffer (cache) memory 830, and an I/O interface 840.

The data storage unit 810 may store data received from the memory controller 820 upon receiving a control signal from the memory controller 820, read the stored data, and output the read data to the memory controller 820. The data storage unit 810 may include various non-volatile memory units having data to remain unchanged when powered off, for example, a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc.

The memory controller 820 may decode a command received from an external device (host device) through an I/O interface 840, and may control data I/O actions of the data storage unit 810 and the buffer memory 830. The memory controller 820 may include the memory controller 620 shown in FIG. 9. Although the memory controller 820 is denoted by one block as shown in FIG. 11 for convenience of description, the memory controller 820 may include a first controller for controlling a non-volatile memory 810 and a second controller for controlling the buffer memory 830 serving as a volatile memory. Here, the first controller and the second controller may be arranged independently from each other.

The buffer memory 830 may temporarily store data to be processed by the memory controller 820. In other words, the buffer memory 830 may temporarily store data to be input/output to/from the data storage unit 810. The buffer memory 830 may store data received from the memory controller 830 upon receiving a control signal from the memory controller 820, read the stored data, and output the read data to the memory controller 820. The buffer memory 830 may include a volatile memory, for example, a Dynamic Random Access Memory (DRAM), a Mobile DRAM, a Static Random Access Memory (SRAM), etc.

The I/O interface 840 may provide a physical connection between the memory controller 820 and the external device (host device), such that the I/O interface 840 may control the memory controller 820 to receive data I/O control signals from the external device as well as to exchange data with the external device. The I/O interface 840 may include at least one of various interface protocols, for example, a universal serial bus (USB) protocol, a multimedia card (MMC) protocol, a peripheral component interconnection (PCI) protocol, a PCI-express (PCI-E) protocol, a serial attached SCSI (SAS), a serial ATA (SATA) protocol, a parallel advanced technology attachment (PATA) protocol, a small computer small interface (SCSI) protocol, an enhanced small disk interface (ESDI) protocol, and an integrated drive electronics (IDE) protocol.

The electronic device 800 may include a through silicon via (TSV) in a semiconductor substrate, separately from various constituent elements (i.e., a data storage unit 810, a memory controller 820, a buffer(cache) memory 830, and an I/O interface 840). The electronic device 800 may include a plurality of TSVs, and may be directly or indirectly coupled to various constituent elements, for example, the data storage unit 810, the memory controller 820, the buffer(cache) memory 830, and the I/O interface 840. A test unit for detecting Cu ions migrated from the TSV may be contained in a KOZ located in the vicinity of the TSV. The test unit is formed in the KOZ as shown in FIG. 2, and may determine the presence or absence of short-circuiting between a metal contact and a gate structure by applying a voltage to the active region through the metal contact, thereby detecting migration of Cu ions.

The electronic device 800 shown in FIG. 11 may be used as an auxiliary memory device or an external storage device of the host device. The electronic device 800 may include a Solid State Disc (SSD), a Universal Serial Bus (USB) memory, a Secure Digital (SD), a mini Secure Digital (mSD) card, a micro SD, a high-capacity Secure Digital High Capacity (SDHC), a memory stick card (MSC), a Smart Media (SM) card, a Multi Media Card (MMC), an Embedded MMC (eMMC), a Compact Flash (CF) card, etc.

Figure 12:
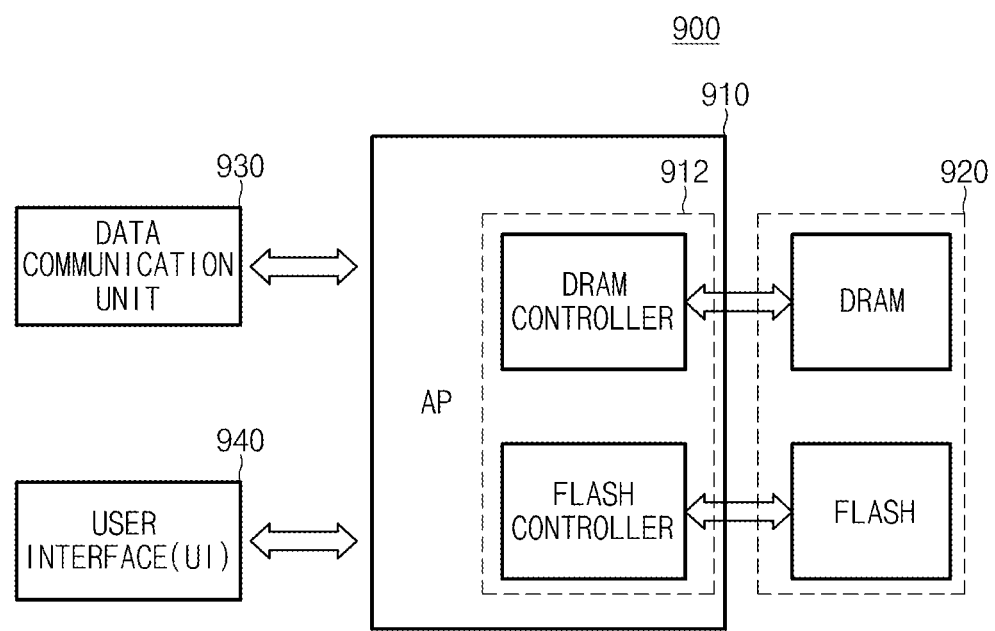
FIG. 12 is a block diagram illustrating an electronic device according to another embodiment.

FIG. 12 is a block diagram illustrating an electronic device according to another embodiment.

Referring to FIG. 12, the electronic device 900 may include an application processor 910, a memory device 920, a data communication unit 930, and a user interface (UI) 940.

The application processor 910 may provide overall control to the electronic device 900, and may be configured to control and adjust a series of operations for processing data in response to an input command received through the user interface (UI) 940 and outputting the processed result. The application processor 910 may be implemented as a multi-core processor so as to perform multi-tasking. Specifically, the application processor 910 may include an SoC-shaped memory controller 912 for controlling data I/O operations of the memory device 920. Here, the memory controller 912 may include not only a first controller for controlling a volatile memory (for example, DRAM) but also a second controller for controlling a non-volatile memory (for example, flash memory). The memory controller 912 may include the memory controller 610 shown in FIG. 9.

Upon receiving a control signal from the memory controller 912, the memory device 920 may store data requisite for operating the electronic device 900, read the stored data, and output the read data to the memory controller 912. The memory device 920 may include a volatile memory and a non-volatile memory. Specifically, the memory device 920 may include a plurality of memory cells for storing data.

The data communication unit 930 may be configured to perform data communication between the application processor 910 and the external device according to a predefined communication protocol. The data communication unit 930 may include a module coupled to a wired network and a module coupled to a wireless network. The wired network module may include a Local Area Network (LAN), a Universal Serial Bus (USB), an Ethernet, a Power Line Communication (PLC), etc. The wireless network module may include Infrared Data Association (IrDA), Code Division Multiple Access (CDMA), Time Division Multiple Access (TDMA), Frequency Division Multiple Access (FDMA), Wireless LAN (WLAN), Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), etc.

The user interface (UI) 940 may provide an interface between a user and the portable electronic device 900 so that the user can input data to the portable electronic device 900. The user interface (UI) 940 may include user I/O devices for informing the user of audio or video signals indicating the processed result of the portable electronic device 900. For example, the user interface (UI) 940 may include a button, a keypad, a display(screen), a speaker, etc. incorporated into the electronic device 900.

The above-mentioned electronic device 900 may be implemented as a handheld device, for example, a mobile phone, a smartphone, a tablet computer, a personal digital assistant (PDA), an enterprise digital assistant (EDA), a digital still camera, a digital video camera, a portable multimedia player (PMP), a personal navigation device or a portable navigation device (PND), a handheld game console, or an e-book. In addition, the electronic device 900 may be implemented as an embedded system for performing a specific function of vehicles or ships.

The electronic device 900 may include a through silicon via (TSV) in a semiconductor substrate, separately from various constituent elements (i.e., an application processor 910, a memory device 920, a data communication unit 930, and a user interface (UI) 940). The electronic device 900 may include a plurality of TSVs, and may be directly or indirectly coupled to various constituent elements, for example, the application processor 910, the memory device 920, the data communication unit 930, and the user interface (UI) 940. A test unit for detecting Cu ions migrated from the TSV may be contained in a KOZ located in the vicinity of the TSV. The test unit is formed in the KOZ as shown in FIG. 2, and may determine the presence or absence of short-circuiting between a metal contact and a gate structure by applying a voltage to the active region through the metal contact, thereby detecting migration of Cu ions.

Figure 13:
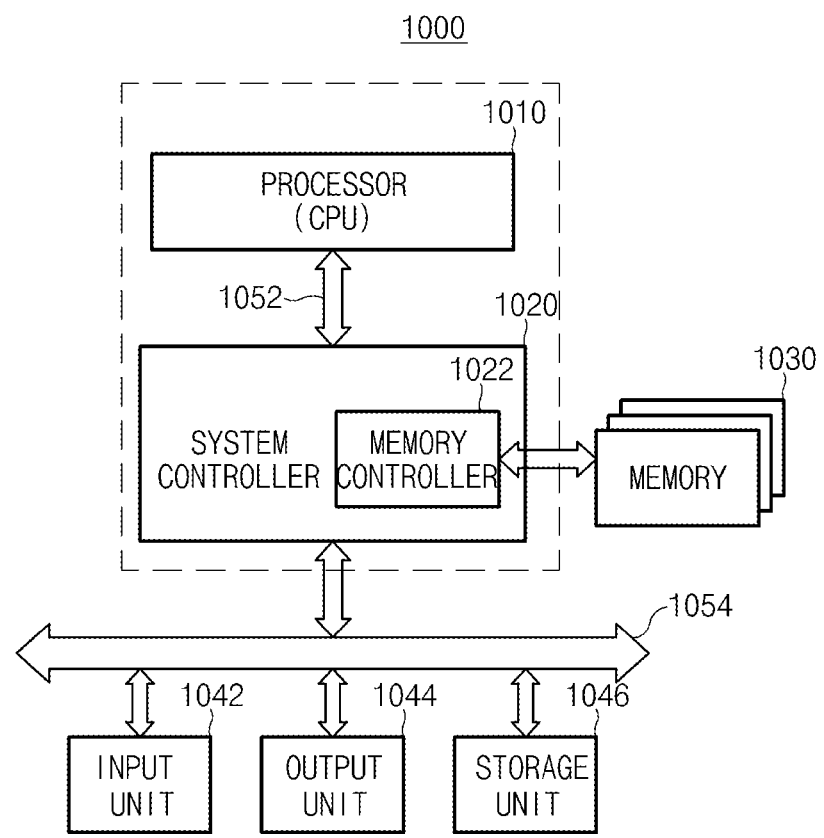
FIG. 13 is a block diagram illustrating an electronic device according to another embodiment.

FIG. 13 is a block diagram illustrating an electronic device according to another embodiment.

Referring to FIG. 13, the electronic device 1000 may include a processor 1010 such as a CPU, a system controller 1020, and a memory device 1030. The electronic device 1000 may further include an input unit 1042, an output unit 1044, a storage unit 1046, a processor bus 1052, and an extended bus 1054.

The processor 1010 may provide overall control to the electronic device 1000, and may be configured to control and adjust a series of operations for processing (or calculating) data (or command) received through the input units 1042 and outputting the processed result to the output unit 1044. The processor 1010 may include a general Central Processing Unit (CPU) or Micro Controller Unit (MCU). The processor 1010 may be coupled to the system controller 1020 through the processor bus 1052 including an address bus, a control bus, and/or a data bus. The system controller 1020 may be coupled to the extended bus 1054 such as a Peripheral Component Interconnection (PCI). Accordingly, the processor 1010 may enable the system controller 1020 to control the input unit 1042 such as a keyboard or mouse, the output unit 1044 such as a printer or display, and the storage unit 1046 such as HDD, SSD, or CDROM. The processor 1010 may be implemented as a multi-core processor.

The system controller 1020 may control data communication between the memory device 1030 and the peripheral devices (1042, 1044, 1046) upon receiving a control signal of the processor 1010. The system controller 1020 may include a memory controller 1022 for controlling data I/O operations of the memory device 1030. In this case, the memory controller 1022 may include the memory controller 610 of FIG. 26. The system controller 1020 may include a Memory Controller Hub (MCH) and I/O Controller Hub (ICU) of Intel Corporation. Although the system controller 1020 and the processor 1010 are separated from each other for convenience of description, the system controller 1020 may be embedded in the processor 1010 or may be incorporated with the processor 1010 into a single SoC-shaped chip. Alternatively, only the memory controller 1022 of the system controller 1020 may be embedded in the processor 1010, or may be fabricated in the form of an SoC such that the SoC-shaped memory controller 1022 may be contained in the processor 1010.

The memory device 1030 may store data received from the memory controller 1022 upon receiving a control signal from the memory controller 1022, read the stored data, and output the read data to the memory controller 1022. The memory device 1030 may include the memory device 610 shown in FIG. 9. That is, the memory device 1030 may include a plurality of TSVs in a semiconductor substrate, and may include a test unit for detecting copper (Cu) ions migrated from the TSV in a Keep Out Zone (KOZ) located in the vicinity of the TSV. The test unit is formed in the KOZ as shown in FIG. 2, and may determine the presence or absence of short-circuiting between a metal contact and a gate structure by applying a voltage to the active region through the metal contact, thereby detecting migration of Cu ions.

The storage unit 1046 may store data to be processed by the electronic device 1000. The storage unit 1046 may include a data storage unit embedded in the computing system or an external storage unit, and may include the memory system 800 shown in FIG. 11.

The electronic system 1000 may be any one of a variety of electronic systems operated by a variety of processes, for example, a personal computer, a server, a Personal Digital Assistant (PDA), a Portable Computer, a Web Tablet, a Wireless Phone, a mobile phone, a smart phone, a digital music player, a Portable Multimedia Player (PMP), an Enterprise Digital Assistant (EDA), a digital still camera, a digital video camera, a Global Positioning System (GPS), a voice recorder, a Telematics, an Audio Visual (AV) System, a Smart Television, other embedded systems, etc.

As is apparent from the above description, the semiconductor device according to embodiments includes a test unit in a Keep Out Zone (KOZ) adjacent to a through silicon via (TSV). The test unit, without increasing a chip area, detects copper (Cu) ions migrated from the TSV, such that a defective part of the semiconductor device can be easily and correctly detected at an earlier fabrication stage.

The above embodiments are therefore to be construed in all aspects as illustrative and not restrictive. The above embodiments are illustrative and not limitative. Various alternatives are possible. The embodiments are not limited by the type of deposition, etching polishing, and patterning steps described herein. Nor are the embodiments limited to any specific type of semiconductor device. For example, the embodiments may be implemented in a dynamic random access memory (DRAM) device or non volatile memory device.

What is claimed is:

1. A semiconductor device comprising:
   a semiconductor substrate including an active region defined by a device isolation region;
   a contact including a metal material and disposed over the semiconductor substrate; and
   a test unit disposed in the vicinity of the contact to determine metal pollution caused by the contact,
   wherein the contact includes a through silicon via (TSV) passing through the semiconductor substrate, and
   wherein the test unit is formed in a region between a logic unit and the TSV, the region being included in a Keep Out Zone (KOZ).

2. The semiconductor device according to claim 1, wherein the test unit includes:
   first and second connection structures spaced apart by a predetermined distance over the semiconductor substrate;
   a third connection structure formed over the active region between the first and second connection structures; and
   a fourth connection structure formed over the second connection structure.

3. The semiconductor device according to claim 2, wherein the first and second connection structures include a metal contact or a metal line.

4. The semiconductor device according to claim 2, wherein the third and fourth connection structures are formed of a metal contact.

5. The semiconductor device according to claim 2, wherein the first and second connection structures include:
   a gate insulation film formed over the semiconductor substrate;
   a polysilicon layer formed over the gate insulation film;
   a metal layer formed over the polysilicon layer; and
   a capping film formed over the metal layer.

6. The semiconductor device according to claim 1, wherein the test unit includes:
   first and second trenches formed in the semiconductor substrate;
   an active region protruded by the first and second trenches;
   an insulation film formed along a step between the semiconductor substrate and the first and second trenches;
   first and second connection structures formed over the insulation film respectively in the first and second trenches and including a conductive material;
   a third connection structure formed over the protruded active region; and
   a fourth connection structure formed over the second connection structure.

7. The semiconductor device according to claim 6, wherein the insulation film is formed over a sidewall and a bottom surface of each of the first and second trenches.

8. The semiconductor device according to claim 6, wherein each of the third and fourth connection structures includes a metal contact.

9. The semiconductor device according to claim 6, further comprising:
   a spacer formed at a sidewall of the third connection structure.

10. The semiconductor device according to claim 6, wherein the test unit further includes a depletion layer formed in a region between the insulation film and the protruded active region.

11. A semiconductor device comprising:
    a logic unit formed over a semiconductor substrate so as to perform a memory operation;
    a through silicon via (TSV) formed to pass through the semiconductor substrate; and
    a test unit formed between the logic unit and the TSV so as to determine the presence or absence of short-circuiting of the semiconductor substrate located in the vicinity of the TSV.

12. The semiconductor device according to claim 11, wherein the test unit is formed in a Keep Out Zone (KOZ) adjacent to the TSV.

13. The semiconductor device according to claim 11, further comprising:
    a measurement unit configured to measure a current flowing in the test unit; and
    a decision unit configured to determine the presence or absence of short-circuiting of the semiconductor substrate of the test unit using a current measurement result obtained from the measurement unit.

14. The semiconductor device according to claim 11, wherein the test unit includes:
    first and second connection structures spaced apart from each other by a predetermined distance over the semiconductor substrate;
    a third connection structure formed over the active region between the first and second connection structures; and
    a metal contact coupled to the second connection structure.

15. The semiconductor device according to claim 14, wherein the measurement unit measures a current value between the first connection structure and the third connection structure, or measures a current value between the second connection structure and the third connection structure.

16. The semiconductor device according to claim 11, wherein the test unit includes:
    first and second trenches formed in the semiconductor substrate;
    an active region protruded by the first and second trenches;
    a third connection structure formed over the protruded active region;
    an insulation film formed along a step between the semiconductor substrate and the first and second trenches;
    first and second connection structures respectively formed in the first and second trenches and over an upper part of the insulation film, each of the first and second connection structures including a conductive material; and
    a metal contact coupled to the second connection structure.

* * * * *